(12) United States Patent
Nagamoto et al.

(10) Patent No.: US 12,416,309 B2
(45) Date of Patent: Sep. 16, 2025

(54) FAN DEVICE

(71) Applicant: MITSUBA Corporation, Gunma (JP)

(72) Inventors: Satoshi Nagamoto, Gunma (JP); Hidetake Ota, Gunma (JP)

(73) Assignee: MITSUBA Corporation, Gunma (JP)

( * ) Notice: Subject to any disclaimer, the term of this patent is extended or adjusted under 35 U.S.C. 154(b) by 0 days.

(21) Appl. No.: 18/558,369

(22) PCT Filed: May 16, 2023

(86) PCT No.: PCT/JP2023/018230
§ 371 (c)(1),
(2) Date: Nov. 1, 2023

(87) PCT Pub. No.: WO2024/105902
PCT Pub. Date: May 23, 2024

(65) Prior Publication Data
US 2025/0084857 A1  Mar. 13, 2025

(30) Foreign Application Priority Data
Nov. 16, 2022  (JP) ................. 2022-183599

(51) Int. Cl.
H05K 7/20 (2006.01)
F04D 25/06 (2006.01)
(Continued)

(52) U.S. Cl.
CPC ......... F04D 25/068 (2013.01); F04D 25/082 (2013.01); F04D 29/281 (2013.01); H05K 7/20136 (2013.01)

(58) Field of Classification Search
CPC .... F04D 25/068; F04D 25/082; F04D 29/281; F01P 5/06; H05K 7/20136–20181
See application file for complete search history.

(56) References Cited

U.S. PATENT DOCUMENTS

2001/0018027 A1* 8/2001 Chen .................. H02K 17/30
310/63
2020/0124054 A1* 4/2020 Nagase ............... F04D 29/522
(Continued)

FOREIGN PATENT DOCUMENTS

| JP | H021498 | 1/1990 |
| JP | H0377025 | 8/1991 |

(Continued)

OTHER PUBLICATIONS

"International Search Report (Form PCT/ISA/210) of PCT/JP2023/018230", mailed on Jul. 11, 2023, pp. 1-3.

(Continued)

Primary Examiner — Jacob R Crum
(74) Attorney, Agent, or Firm — JCIPRNET

(57) ABSTRACT

A fan device (1) includes a shroud (4) including a motor support unit (42), a fan (3) disposed on a surface side of the motor support unit (42), and a motor (2) supported on a rear side of the motor support unit (42). Multiple air guide passages (426) each penetrating in a thickness direction at positions spaced apart in a circumferential direction and radially outward from a boss 31 of the fan (3) are formed in the motor support unit (42). The fan device (1) further includes an air guide unit (52) that is disposed facing the air guide passage (426) on the rear side of the motor support unit (42), and guides cooling air generated by the fan (3) and passed through the air guide passage (426) to a rear side of a motor bracket (21).

6 Claims, 8 Drawing Sheets

(51) Int. Cl.
    *F04D 25/08*     (2006.01)
    *F04D 29/28*     (2006.01)

(56) References Cited

U.S. PATENT DOCUMENTS

| | | | |
|---|---|---|---|
| 2020/0128694 A1* | 4/2020 | Moreno | F04D 29/36 |
| 2023/0138791 A1* | 5/2023 | Son | F24F 13/085 |
| | | | 55/467 |

FOREIGN PATENT DOCUMENTS

| | | |
|---|---|---|
| JP | 2009074462 | 4/2009 |
| JP | 2015158203 | 9/2015 |
| JP | 2019052576 | 4/2019 |
| KR | 20030052300 | 6/2003 |

OTHER PUBLICATIONS

"International Preliminary report on patentability (Form PCT/IB/338) mailed on May 30, 2025, International Preliminary Report on patentability (Form PCT/IB/373) issued Apr. 29, 2025, Written Opinion (Form PCT/ISA/237) with English translation thereof mailed on Jul. 11, 2023, and International Preliminary report on patentability (Form PCT/IB/326) mailed on May 30, 2025 of PCT/JP2023/018230", pp. 1-9.

* cited by examiner

FAN DEVICE

CROSS-REFERENCE TO RELATED APPLICATION

This application is a 371 application of the International PCT application serial no. PCT/JP2023/018230, filed on May 16, 2023, which claims the priority benefits of Japan Patent Application No. 2022-183599, filed on Nov. 16, 2022. The entirety of each of the above-mentioned patent applications is hereby incorporated by reference herein and made a part of this specification.

TECHNICAL FIELD

The present invention relates to a fan device that generates cooling air.

RELATED ART

In recent years, efforts are being made to promote the Sustainable Development Goals (the 2030 Agenda for Sustainable Development, adopted by the United Nations Summit on Sep. 25, 2015, hereinafter referred to as "SDGs"). Along with this, techniques that aim to reduce waste and defective products in order to secure sustainable production and consumption patterns are known.

Conventionally, as a fan device that supplies cooling air to a radiator, there is a device which integrates a fan that generates cooling air, a motor that rotates the fan and a shroud that supports the fan and the motor.

In the fan device configured as described above, since the motor itself also generates heat, measures have to be taken to cool the motor in addition to supplying cooling air to the radiator. For example, Patent Literature 1 discloses a configuration in which a portion of a heat shield plate covering the back face of a motor is extended radially outward to guide a portion of cooling air generated by a fan to the motor.

CITATION LIST

Patent Literature

[Patent Literature 1] Japanese Patent Application Laid-Open No. 2019-52576

SUMMARY OF INVENTION

Technical Problem

In the configuration of Patent Literature 1, the flow of cooling air that is about to pass through the fan device is blocked by the heat shield plate which is greatly extended radially outward. Therefore, in order to ensure the cooling air needed for cooling the radiator, measures such as increasing the diameter of the fan have to be taken.

Accordingly, an object of the present invention is to provide a fan device capable of ensuring cooling air needed for cooling an object to be cooled and appropriately cooling a motor without increasing the size of the fan device.

Solution to Problem

In order to achieve the above object, the present invention provides a fan device, which includes a motor that includes a motor bracket, a rotor rotatably supported on a surface side of the motor bracket, a stator fixed to the surface side of the motor bracket and wound with a coil that generates a magnetic field for rotating the rotor, and a driver circuit fixed to a rear side of the motor bracket and controlling generation of the magnetic field by the coil; a fan that includes a boss fixed to the rotor, and blades each protruding radially outward from positions spaced apart in a circumferential direction on an outer peripheral surface of the boss; and a shroud that includes a shroud body formed with a fan housing hole that houses the fan, a motor support unit supporting the motor at a center of the fan housing hole, and multiple stays radially extending from the motor support unit toward the shroud body. In the fan device, the fan is disposed on a surface side of the motor support unit, the motor is supported on a rear side of the motor support unit, and multiple air guide passages each penetrating in a thickness direction at positions spaced apart in the circumferential direction and radially outward from the boss are formed in the motor support unit. The fan device further includes an air guide unit disposed facing the air guide passage on the rear side of the motor support unit, and guiding cooling air generated by the fan and passing through the air guide passage to the rear side of the motor bracket.

Effects of Invention

According to the present invention, a fan device capable of ensuring cooling air needed for cooling an object to be cooled and appropriately cooling a motor without increasing the size of the fan device may be obtained. Problems, configurations and effects other than those described above will be clarified by the description of embodiments below.

DESCRIPTION OF EMBODIMENTS

Hereinafter, as an aspect of a fan device according to an embodiment of the present invention, for example, a fan device 1 that is mounted in a vehicle such as an automobile and cools engine cooling water that flows through a radiator (an object to be cooled) will be described.

(Overall Configuration of Fan Device 1)

Figures 1A, 1B:
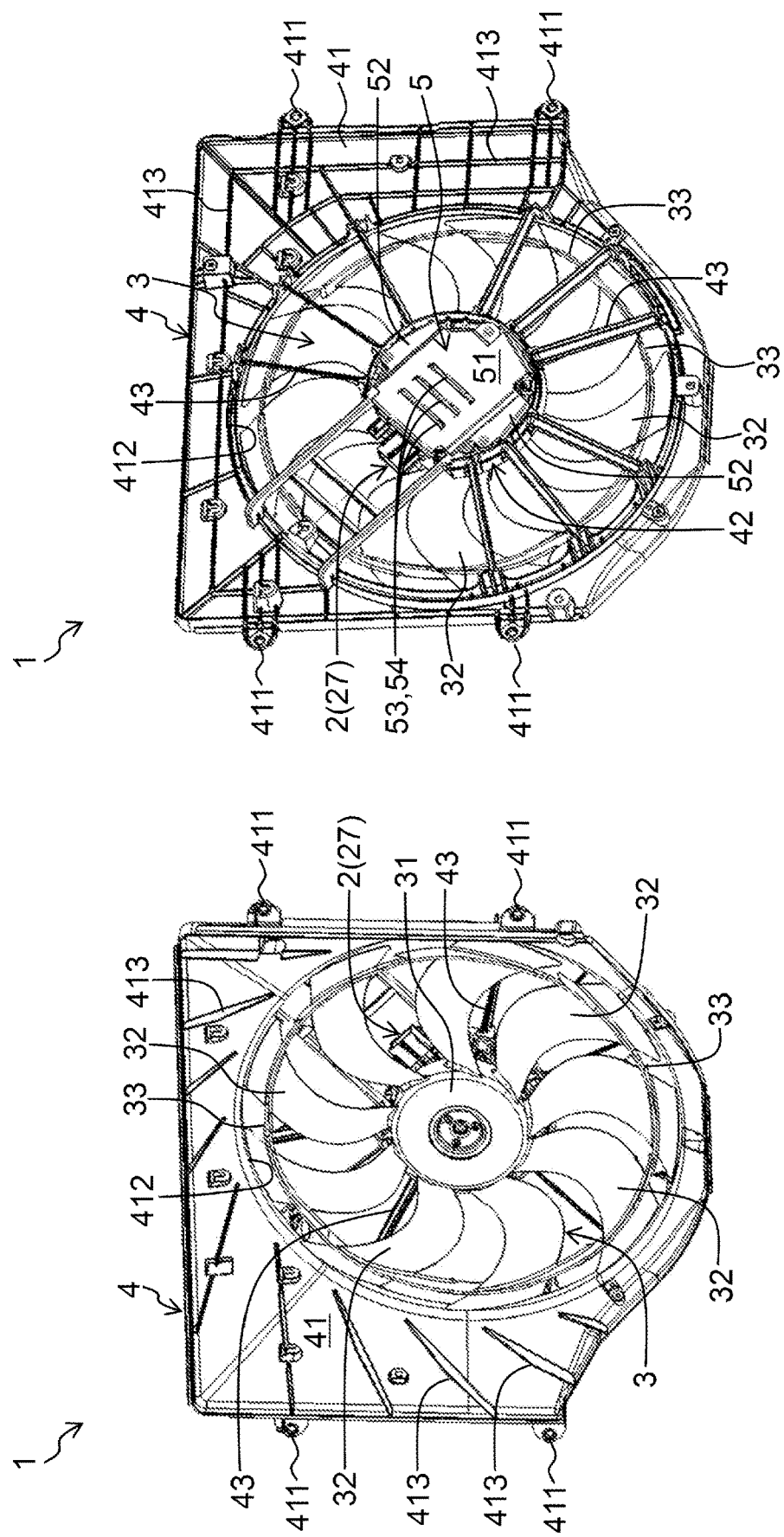
FIGS. 1A and 1B are external perspective views of a surface side and a rear side of a fan device respectively.
Figure 2:
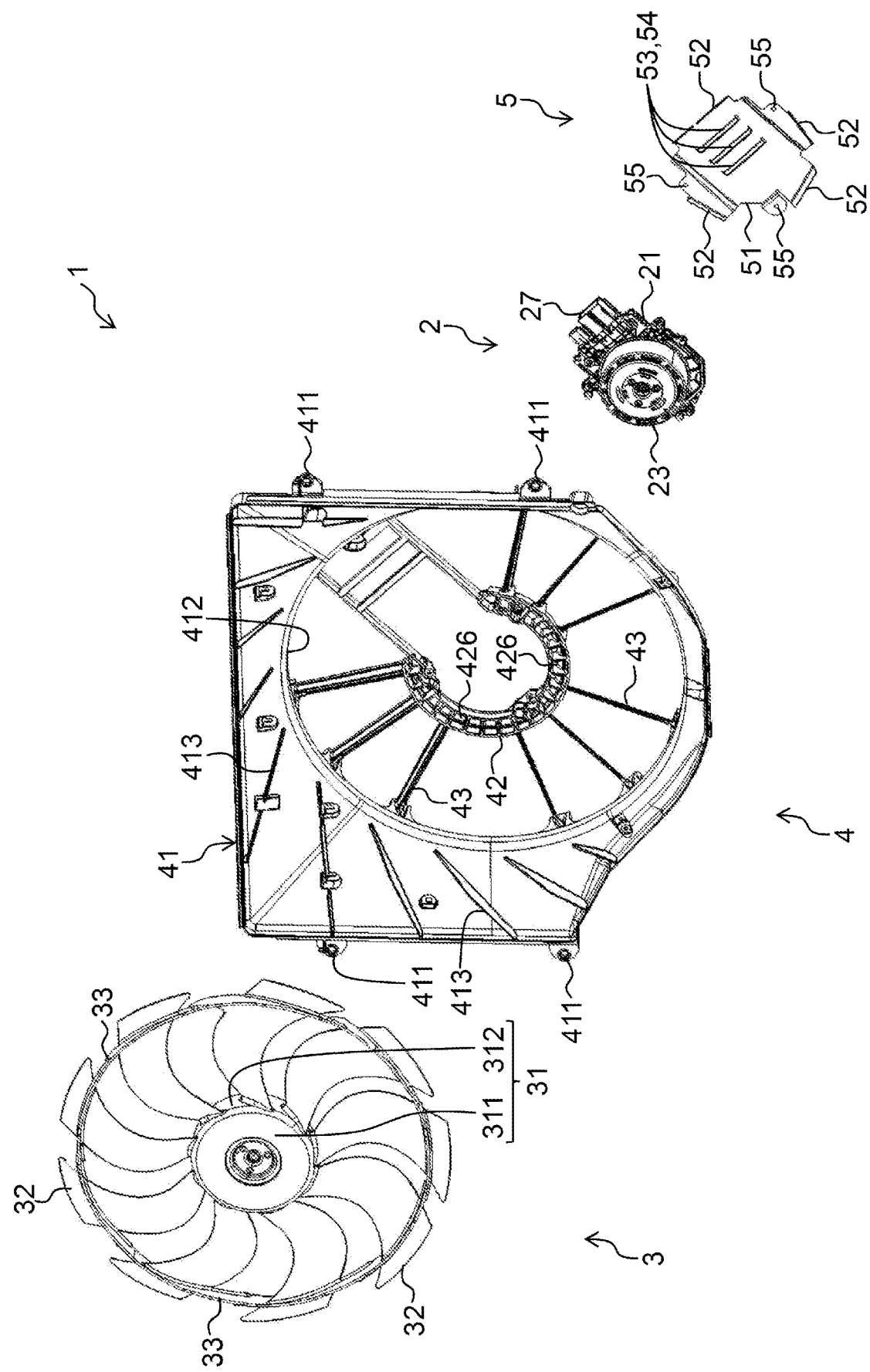
FIG. 2 is an exploded perspective view of the fan device viewed from the surface side.
Figure 3:
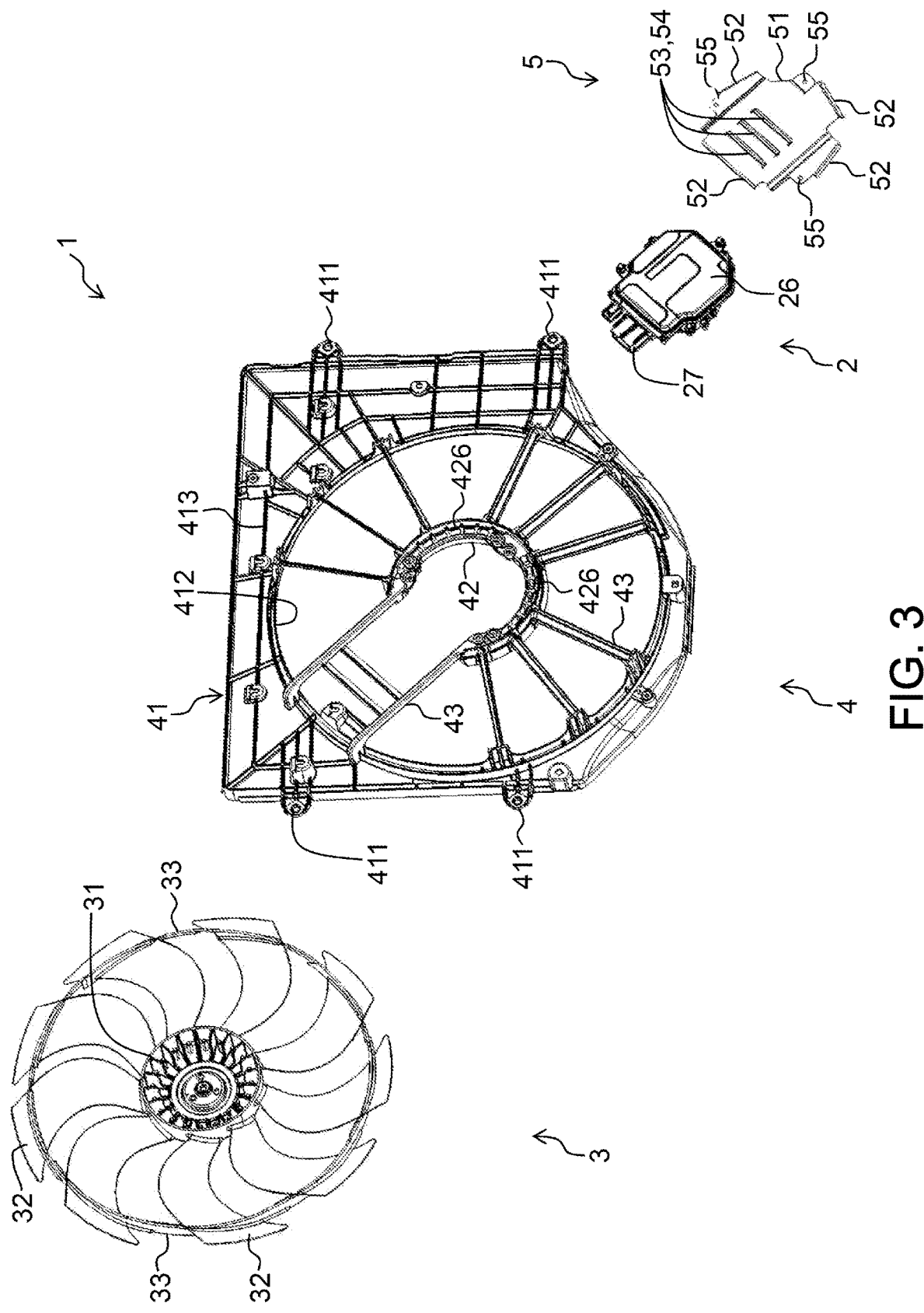
FIG. 3 is an exploded perspective view of the fan device viewed from the rear side.

First, an overall configuration of the fan device 1 will be described with reference to FIGS. 1A, 1B and 2. FIGS. 1A and 1B are external perspective views of a surface side and a rear side of the fan device 1 respectively. FIG. 2 is an exploded perspective view of the fan device 1 viewed from the surface side. FIG. 3 is an exploded perspective view of the fan device 1 viewed from the rear side. As shown in FIGS. 1A to 3, the fan device 1 mainly includes a motor 2, a fan 3, a shroud 4 and a heat shield plate 5.

The fan device 1 is disposed, for example, in an engine room so as to face the radiator in a front-back direction. More specifically, in the engine room of a general automobile, the radiator, the fan device 1 and the engine are disposed in the order from the front to the back. That is, the fan device 1 is disposed between the radiator and the engine in the front-back direction. Hereinafter, the front side (radiator side) of the fan device 1 is referred to as a "surface side", and the back side (engine side) of the fan device 1 is referred to as a "rear side".

The shroud 4 is fixed in the engine room with bolts or the like. In addition, the shroud 4 supports the motor 2 and houses the fan 3 attached to the motor 2. The fan 3 generates cooling air flowing from the surface side of the fan device 1 to the rear side by rotating when a driving force of the motor 2 is transmitted to the fan 3. The heat shield plate 5 blocks radiant heat emitted from the engine and prevents the radiant heat from reaching the motor 2 by covering the motor 2 from the rear side.

As the fan 3 rotates, the front side of the fan device 1 (that is, the area where the radiator is disposed) becomes negative pressure. As a result, the cooling air flowing from the front side to the back side is also generated in the area where the radiator is disposed. Then, as the amount of the cooling air passing through the fan device 1 from the surface side to the rear side increases, the amount of the cooling air passing through the radiator also increases.

Configuration of Motor 2

Figure 4:
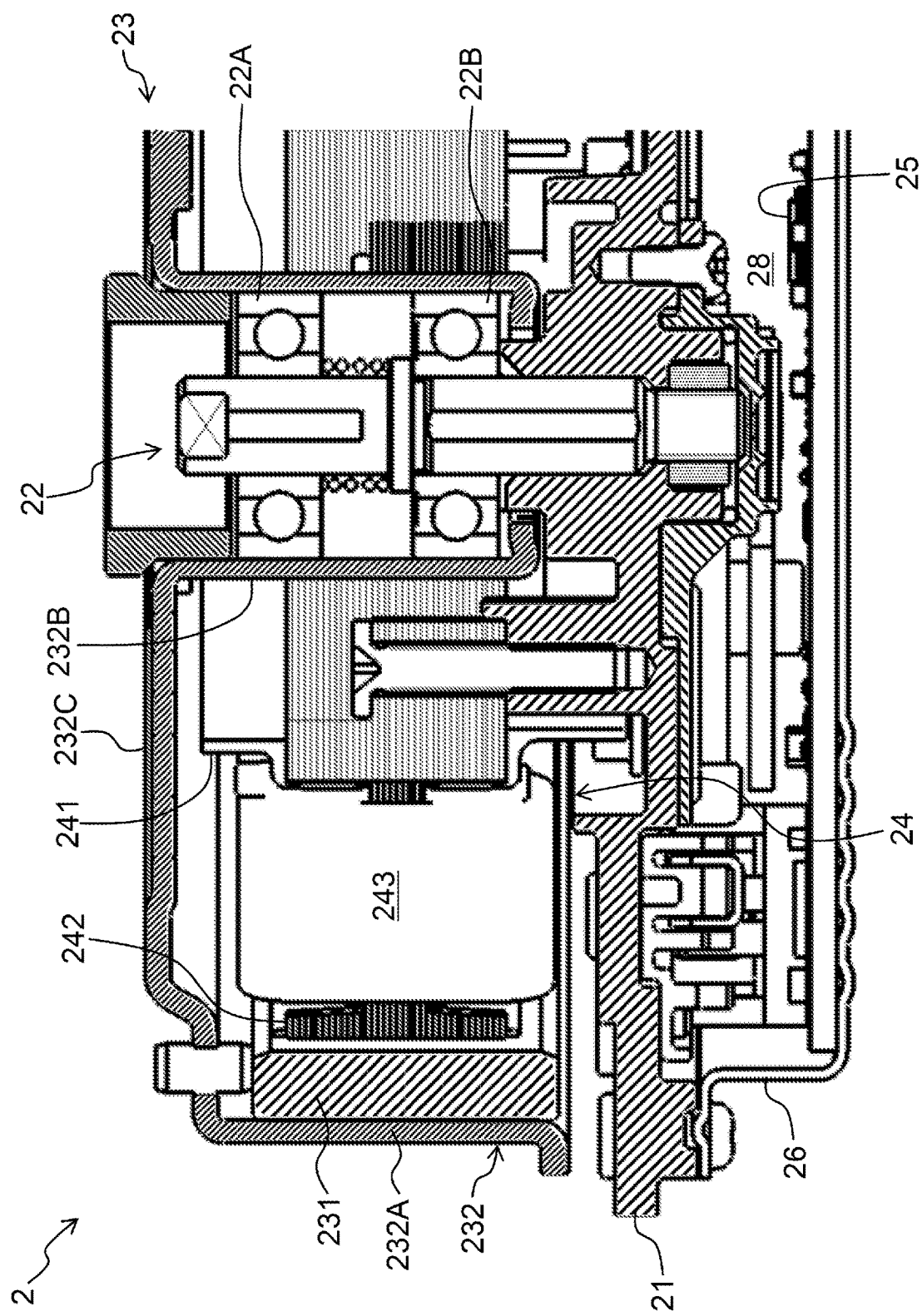
FIG. 4 is a longitudinal sectional view of a motor.

Next, a configuration of the motor 2 will be described with reference to FIG. 4. FIG. 4 is a longitudinal sectional view of the motor 2. The motor 2 according to the embodiment is a brushless motor on an outer rotor side. In addition, the motor 2 is a so-called "mechanical and electrical integrated type" electric motor in which a driver circuit 25 controlling the brushless motor is integrated. As shown in FIG. 4, the motor 2 mainly includes a motor bracket 21, a shaft 22, a rotor 23, a stator 24, the driver circuit 25, a driver case 26 and a connector unit 27 (see FIGS. 2 and 3).

The motor bracket 21 presents an outer shape of a generally plate-like shape. The motor bracket 21 supports the components of the motor 2 (i.e., the shaft 22, the rotor 23, the stator 24, the driver circuit 25, the driver case 26 and the connector unit 27) on the surface side or the back surface side.

One end of an axial direction of the shaft 22 is fixed to a surface side of the motor bracket 21. Hereinafter, the axial direction of the shaft 22 is simply referred to as the "axial direction", a radial direction centered on an axis of the shaft 22 is simply referred to as the "radial direction" and a circumferential direction centered on the axis of the shaft 22 is simply referred to as the "circumferential direction".

The rotor 23 is rotatably supported on the shaft 22 via bearings 22A and 22B on the surface side of the motor bracket 21. The rotor 23 includes multiple permanent magnets 231 disposed circumferentially at equal intervals to surround the outer circumference of the stator 24 and a rotor yoke 232 covering the stator 24 and the permanent magnets 231. Then, the rotor yoke 232 is disposed on the surface side of the motor bracket 21 to be concentric with the axis of the shaft 22. The rotor yoke 232 includes an outer peripheral wall 232A, an inner peripheral wall 232B and a connecting wall 232C.

The outer peripheral wall 232A presents an outer shape of a cylindrical shape. In addition, the outer peripheral wall 232A is disposed outside from the stator 24 in the radial direction. Further, the outer peripheral wall 232A supports the permanent magnets 231 on the inner peripheral surface thereof. In other words, the permanent magnets 231 are fixed to the inner peripheral surface of the outer peripheral wall 232A at predetermined intervals in the circumferential direction.

The inner peripheral wall 232B presents an outer shape of a cylindrical shape. In addition, the inner peripheral wall 232B is disposed inside from the stator 24 in the radial direction. Furthermore, the inner peripheral wall 232B is rotatably supported by the shaft 22 via the bearings 22A and 22B.

The connecting wall 232C presents an outer shape of a disk shape. In addition, the connecting wall 232C connects end parts of the outer peripheral wall 232A and the inner peripheral wall 232B in the axial direction. More specifically, the connecting wall 232C connects the outer peripheral wall 232A and the inner peripheral wall 232B on the other end side of the shaft 22 in the axial direction (that is, the side opposite to the motor bracket 21).

The stator 24 is housed in a space surrounded by the outer peripheral wall 232A, the inner peripheral wall 232B, the connecting wall 232C and the motor bracket 21. In addition, the stator 24 is fixed to the surface side of the motor bracket 21 inside from the permanent magnets 231 in the radial direction. Furthermore, the stator 24 faces the permanent magnets 231 with the predetermined intervals in the radial direction.

The stator 24 includes a stator core 241 of a cylindrical shape, multiple teeth 242 protruding radially outward from the stator core 241 and a coil 243 of conductivity wound around the teeth 242 covered with an insulating insulator. The stator 24 generates a magnetic field when a current flows through the coil 243. Then, the rotor yoke 232 rotates around an axial center of the shaft 22 as the center due to the magnetic field generated by the coil 243 and the attractive force and repulsive force generated between the permanent magnets 231.

The driver circuit 25 controls the generation of the magnetic field by the coil 243 by switching the timing of current supply to the coil 243. The driver circuit 25 is configured of a circuit board and electronic components mounted on the circuit board. The driver case 26 is fixed to a rear side of the motor bracket 21 (that is, the side opposite to the shaft 22, the rotor 23 and the stator 24). A housing space 28 is formed between the rear surface of the motor bracket 21 and the driver case 26. The driver circuit 25 is housed in the housing space 28 formed on the rear side of the motor bracket 21.

As shown in FIGS. 2 and 3, the connector unit 27 is attached to the end part of the motor bracket 21. The connector unit 27 is formed by integrating two connectors to which an external harness is connected. The driver circuit 25 is electrically connected to an external device (for example, a control device of an automobile) via the connector unit 27.

(Configuration of Fan 3)

As shown in FIGS. 1A to 3, the fan 3 includes a boss 31 fixed to the rotor yoke 232, multiple (nine in the embodiment) blades 32 each protruding radially outward from positions spaced apart in the circumferential direction of an outer peripheral surface of the boss 31 and multiple (nine in the embodiment) connecting members 33 that connect adjacent blades 32 on the tip end side. The fan 3 rotates integrally with the rotor 23 around the axial center of the shaft 2 as the center of rotation.

In addition, the boss 31 includes a disk unit 311 of a disk shape and a peripheral wall unit 312 of a cylindrical shape protruding toward the motor 2 from an outer edge of the disk unit 311 and has multiple blades 32 attached thereto. When the fan 3 is attached to the motor 2, the disk unit 311 faces the connecting wall 232C of the rotor yoke 232 and the peripheral wall unit 312 surrounds the outer peripheral wall 232A of the rotor yoke 232. That is, the inner diameter dimension of the peripheral wall unit 312 of the boss 31 is set slightly larger than the outer dimension of the rotor yoke 232.

(Configuration of Shroud 4)

Figure 5A:
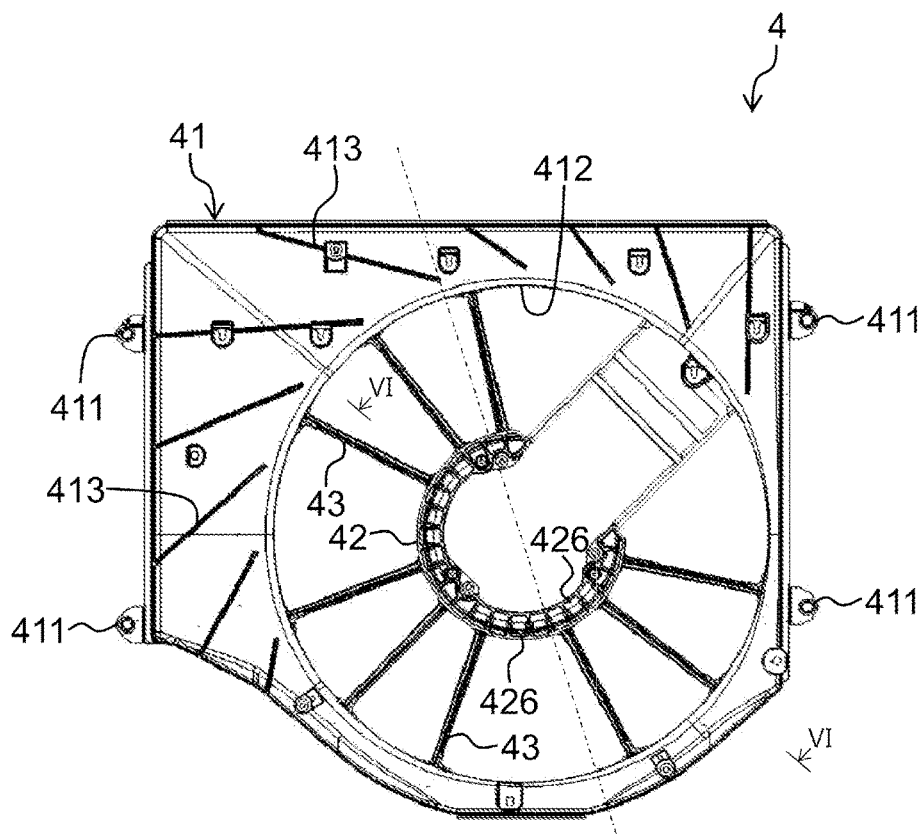
FIGS. 5A and 5B are a surface view and rear view of a shroud respectively.
Figure 5B:
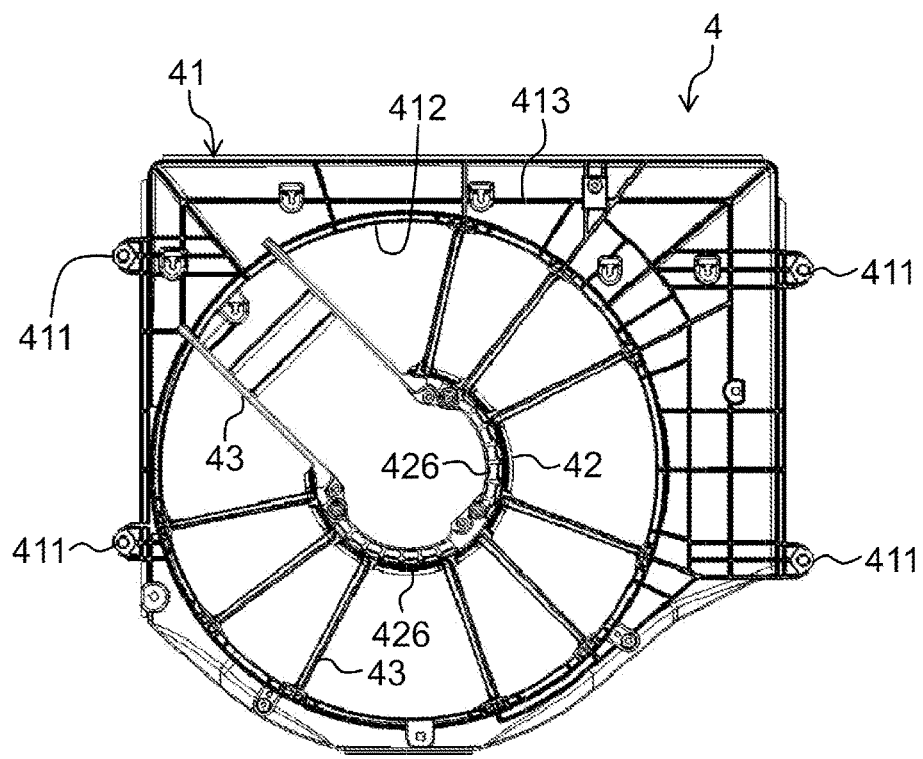
Figure 6:
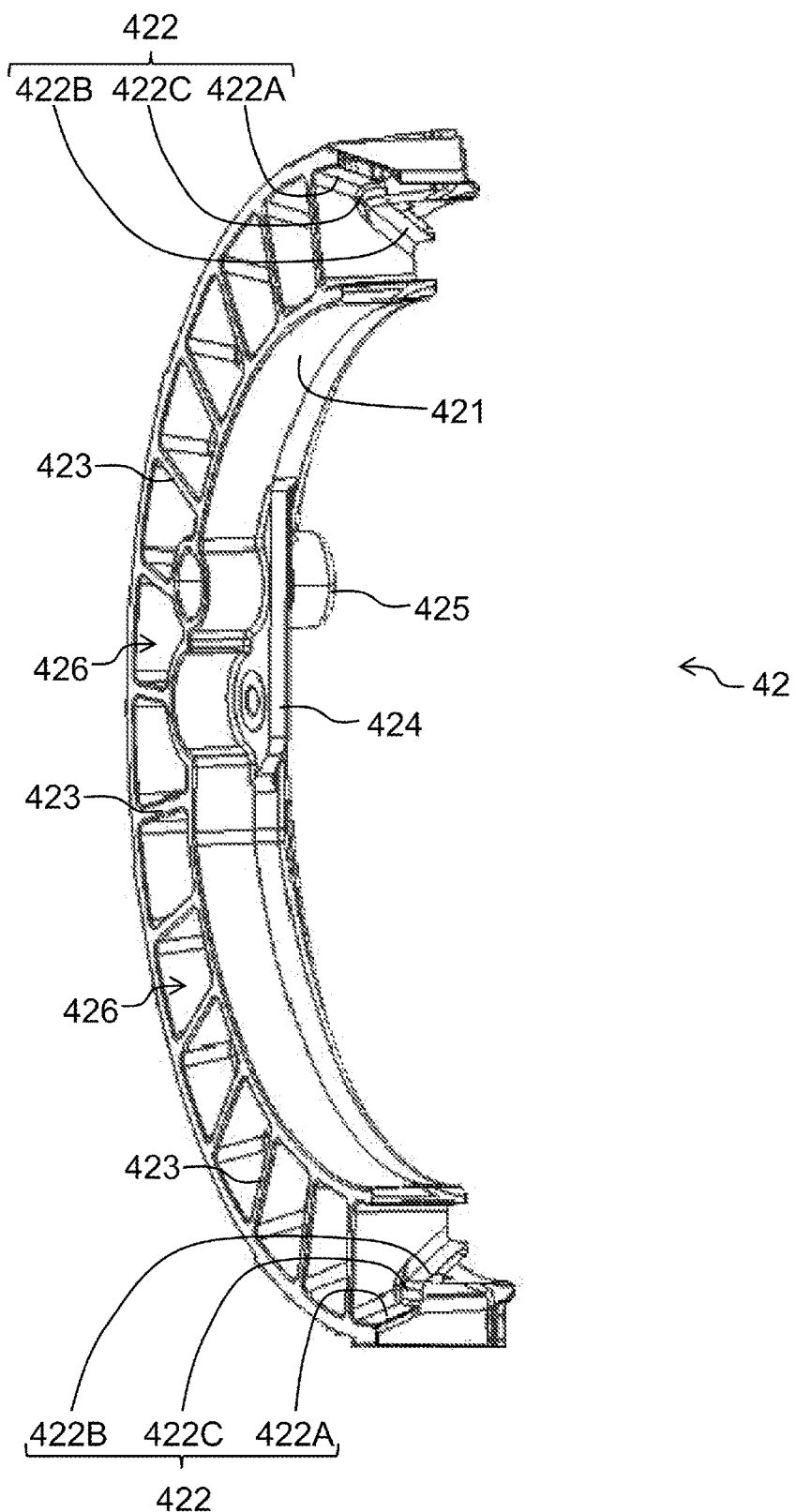
FIG. 6 is a cross-sectional view of a motor support unit taken along a line VI-VI of FIG. 5A.

FIGS. 5A and 5B are a surface view and a rear view of the shroud 4. FIG. 6 is a cross-sectional view of a motor support unit 42 taken along a line VI-VI of FIG. 5A. As shown in FIGS. 5A, 5B and 6, the shroud 4 is configured of a shroud body 41, the motor support unit 42 and multiple stays 43 (11 stays in the embodiment). The shroud 4 is integrally molded, for example, by injection molding a resin material.

The shroud body 41 present an outer shape of a generally plate-like shape. On an outer peripheral surface of the shroud body 41, multiple fixed units 411 are provided for fixing the shroud 4 (in other words, the fan device 1) in the engine room with bolts or the like. In addition, a fan housing hole 412 penetrating in the thickness direction is formed in the shroud body 41. The fan housing hole 412 is a through hole of a circular shape for housing the fan 3. That is, the diameter of the fan housing hole 412 is set to be slightly larger than the outer dimension of the fan 3 (that is, the diameter of an imaginary circle connecting the tip ends of the blades 32).

Furthermore, multiple reinforcing ribs 413 are formed on the front face and the back face of the shroud body 41. The reinforcing ribs 413 protrude in the thickness direction from the front face and the back face of the shroud body 41 and extend in any direction. For example, as shown in FIG. 5A, the reinforcing ribs 413 on the surface side of the shroud body 41 may be inclined radially outward in the opposite direction (counterclockwise) to a rotation direction (clockwise) of the fan 3 with respect to an imaginary line (dotted chain line) extending in the radial direction through the center of the fan housing hole 412. As a result, the air on the surface side of the shroud body 41 may smoothly flow into the fan housing hole 412 so that the amount of the cooling air passing through the fan device 1 increases.

The motor support unit 42 is disposed inside the fan housing hole 412 (more specifically, in the center of the fan housing hole 412) to support the motor 2. The motor support unit 42 presents an outer shape of a generally arc shape. As shown in FIGS. 5A, 5B and 6, the motor support unit 42 mainly includes an inner peripheral wall 421, an outer peripheral wall 422, multiple connection walls 423, a motor fixing unit 424 and a heat shield plate fixing unit 425.

The inner peripheral wall 421 and the outer peripheral wall 422 present outer shapes of generally arc shapes. The outer peripheral wall 422 is disposed radially outside from the inner peripheral wall 421. That is, the inner peripheral wall 421 and the outer peripheral wall 422 are disposed with a predetermined interval in the radial direction. Also, the inner diameter dimension of the inner peripheral wall 421 is set slightly larger than the outer dimension of the rotor yoke 232. Furthermore, the outer dimension of the inner peripheral wall 421 is set slightly larger than the outer dimension of the boss 31 (more specifically, the peripheral wall unit 312).

The connection walls 423 connect the outer peripheral surface of the inner peripheral wall 421 and the inner peripheral surface of the outer peripheral wall 422 at positions spaced apart in the circumferential direction. As a result, a space surrounded by the outer peripheral surface of the inner peripheral wall 421, the inner peripheral surface of the outer peripheral wall 422 and the connections wall 423 that are adjacent functions as an air guide passage 426 that penetrates the motor support unit 42 in the thickness direction. That is, multiple air guide passages 426 each penetrating in the thickness direction at positions spaced apart in the circumferential direction are formed in the motor support unit 42.

When the motor 2 and the fan 3 are attached to the shroud 4, the air guide passages 426 are located radially outside from the boss 31. In other words, when the shroud 4 is viewed in a plane from the thickness direction, the air guide passages 426 face the blades 32. As a result, the cooling air generated by the fan 3 (more specifically, the blades 32) passes through the air guide passage 426 from the surface side of the motor support unit 42 to the rear side thereof.

As shown in FIG. 6, the outer peripheral surface of the inner peripheral wall 421 defining the air guide passage 426 extends generally in the thickness direction of the motor support unit 42 (in other words, the shroud 4). On the other hand, the inner peripheral surface of the outer peripheral wall 422 defining the air guide passage 426 is inclined radially inward from the surface side of the motor support unit 42 toward the rear side thereof. That is, the air guide passage 426 is inclined radially inward from the surface side of the motor support unit 42 toward the rear side thereof. Furthermore, the opening area of the air guide passage 426 on the back surface side of the motor support unit 42 is set smaller than the opening area of the air guide passage 426 on the surface side of the motor support unit 42. That is, the opening area of the air guide passage 426 gradually decreases from the surface side of the motor support unit 42 toward the rear side thereof.

More specifically, the inner peripheral surface of the outer peripheral wall 422 defining the air guide passage 426 is configured of a first surface 422A on the surface side of the motor support unit 42, a second surface 422B on the rear side of the motor support unit 42 and a step 422C between the first surface 422A and the second surface 422B. Then, both the first surface 422A and the second surface 422B are inclined radially inward from the surface side of the motor support unit 42 toward the rear side thereof. However, the inclination angle of the second surface 422B is set larger than the inclination angle of the first surface 422A. As a result, the opening area of the air guide passage 426 gently decreases in the area of the first surface 422A and rapidly decreases in the area of the second surface 422B from the surface side of the motor support unit 42 to the rear side thereof.

The motor fixing unit 424 is a portion through which a bolt for fixing the motor 2 to the motor support unit 42 is inserted. More specifically, the surface side of the motor 2 is brought into contact with the rear side of the motor support unit 42. As a result, a bolt hole provided in the motor bracket 21 and a bolt hole provided in the motor fixing unit 424 communicate with each other. The motor 2 is supported on the rear side of the motor support unit 42 by screwing a nut onto the tip end of a bolt that has passed through the bolt holes that have communicated. At this time, the rotor yoke 232 passes through the inner peripheral wall 421 and protrudes from the surface side of the motor support unit 42. Further, the fan 3 is attached to the motor 2 by placing the boss 31 over the rotor yoke 232 protruding from the surface side of the motor support unit 42 and fixing the boss 31 with bolts. That is, the fan 3 is disposed on the surface side of the motor support unit 42.

The heat shield plate fixing unit 425 is a portion through which a bolt for fixing the heat shield plate 5 to the motor support unit 42 is inserted. The heat shield plate 5 is disposed to cover the motor 2 attached to the motor support unit 42 from the rear side. As a result, bolt holes 55 (see FIGS. 7A and 7B) penetrating the heat shield plate 5 in the thickness direction and bolt holes provided in the heat shield plate fixing unit 425 communicate with each other. Then, by screwing a nut onto the tip end of a bolt that has passed through the bolt holes that have communicated, the heat shield plate 5 covering the motor 2 from the rear side is fixed to the motor support unit 42. When the heat shield plate 5 is attached to the heat shield plate fixing unit 425, a space through which the cooling air flows is formed between the driver case 26 and a heat shield plate body 51.

The stays 43 radially extend from the motor support unit 42 toward the shroud body 41 at positions spaced apart in the circumferential direction. More specifically, the stays 43 connect the outer peripheral surface of the outer peripheral wall 422 and a surface defining the fan housing hole 412 of the shroud body 41. As a result, the motor support unit 42 is supported by the shroud body 41 at the center of the fan housing hole 412.

(Configuration of Heat Shield Plate 5)

Figure 7A:
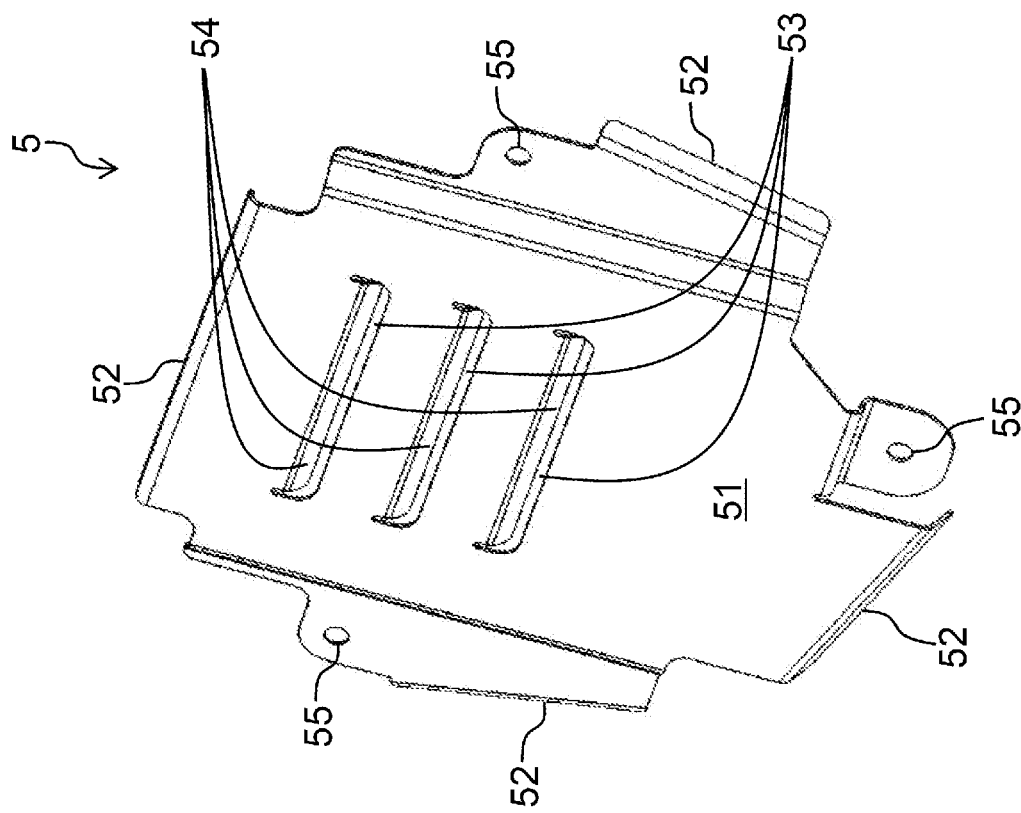
FIGS. 7A and 7B are perspective views of a surface side and a rear side of a heat shield plate.
Figure 7B:
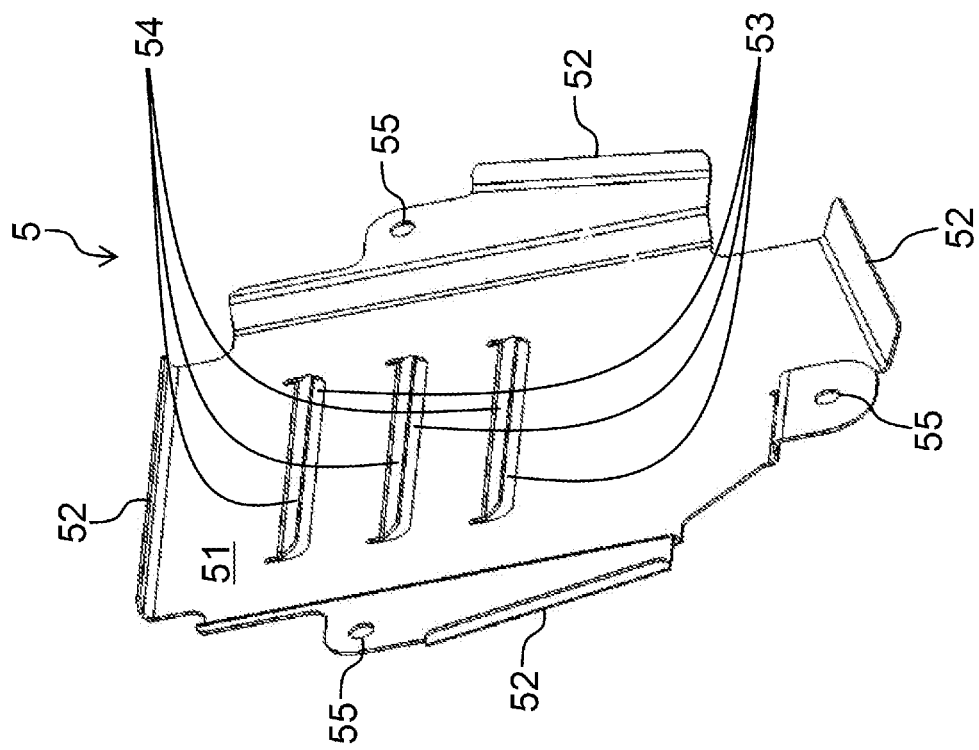
Figure 8:
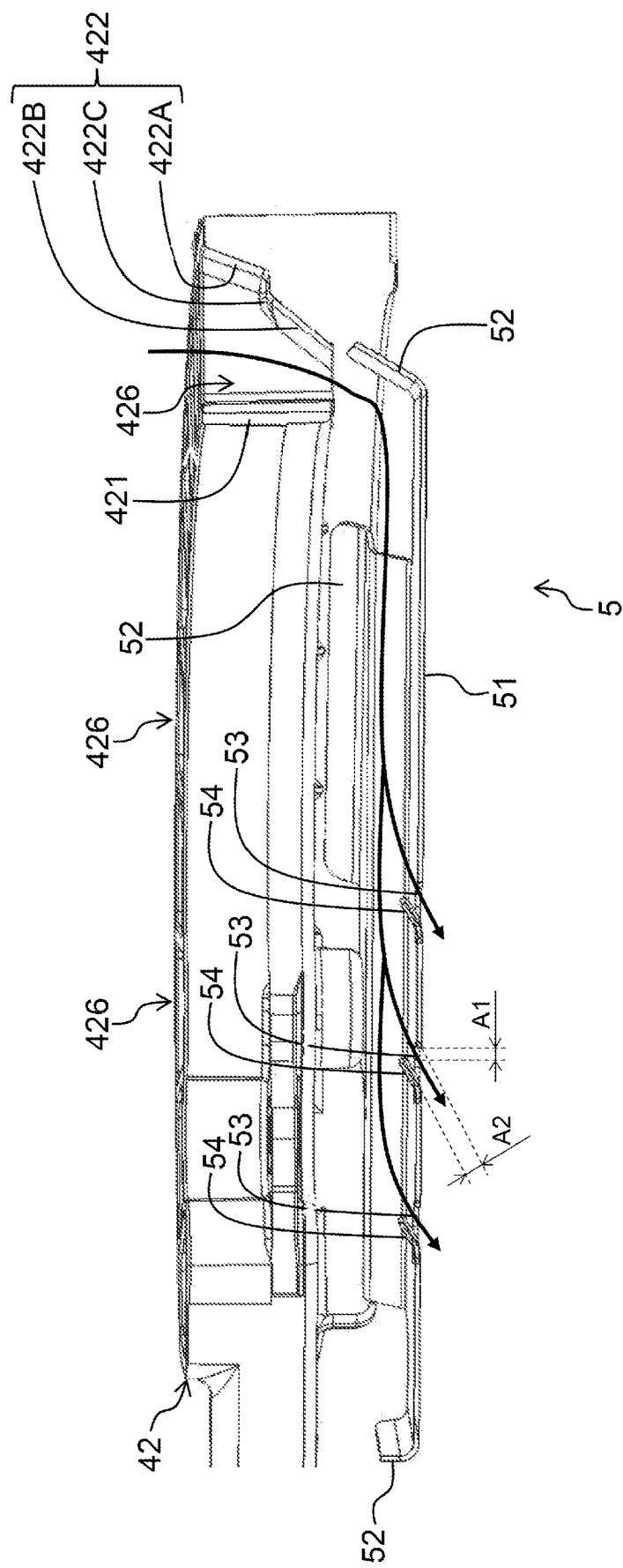
FIG. 8 is a cross-sectional view of main parts of the motor support unit and the heat shield plate.

FIGS. 7A and 7B are perspective views of a surface side and a rear side of the heat shield plate 5. FIG. 8 is a cross-sectional view of main parts of the motor support unit 42 and the heat shield plate 5. The heat shield plate 5 is disposed between the motor 2 and the engine. In this way, an infrared ray emitted from the engine is prevented from reaching the motor 2 (in other words, radiant heat of the engine is blocked). Also, the heat shield plate 5 discharges the cooling air guided to the rear side of the motor 2 through the air guide passage 426 and an air guide unit 52 to be described later. As shown in FIGS. 7A and 7B, the heat shield plate 5 mainly includes the heat shield plate body 51 and multiple air guide units 52.

The heat shield plate body 51 presents an outer shape of a generally plate-like shape. Multiple air discharge holes 53 and multiple louvers 54 are formed in the heat shield plate body 51. The air discharge hole 53 is a through hole penetrating through the heat shield plate body 51 in the thickness direction. The air discharge hole 53 according to the embodiment is an elongated hole formed in a slit shape. The air discharge hole 53 discharges the cooling air guided between the driver case 26 and the heat shield plate body 51 by the air guide unit 52.

The louver 54 is provided adjacent to the air discharge hole 53. The louver 54 is provided to be inclined with respect to the thickness direction of the heat shield plate body 51. More specifically, the louver 54 is inclined toward the surface side of the heat shield plate body 51 (that is, toward the motor 2 side). Then, the louver 54 controls the discharge direction of the cooling air through the air discharge hole 53. More specifically, the louver 54 discharges the cooling air guided between the driver case 26 and the heat shield plate body 51 through the air discharge hole 53 along the inclined surface of the louver 54. Furthermore, as shown in FIG. 8, an opening area A1 of the air discharge hole 53 viewed from the thickness direction of the heat shield plate 5 is set smaller than an opening area A2 of the air discharge hole 53 viewed obliquely along the inclination direction of the louver 54.

Multiple air guide units 52 are provided at an outer edge portion of the heat shield plate body 51. The air guide unit 52 is inclined toward the surface side of the heat shield plate body 51 (that is, toward the motor support unit 42 side). Further, as shown in FIG. 8, when the heat shield plate 5 is attached to the heat shield plate fixing unit 425, the air guide unit 52 is disposed to face the air guide passage 426 on the rear side of the motor support unit 42. In addition, the air guide unit 52 is located radially inward from the outer peripheral wall 422. The air guide unit 52 guides the cooling air generated by the fan 3 and passed through the air guide passage 426 to the rear side of the motor bracket 21 (in other words, the space between the driver case 26 and the heat shield plate fixing unit 425).

As a result, as indicated by arrows in FIG. 8, the cooling air generated by the fan 3 inclines radially inward along the inner peripheral surface of the outer peripheral wall 422 and accelerates as the opening area is reduced. Also, the cooling air that has passed through the air guide passage 426 is guided to the space between the driver case 26 and the heat shield plate fixing unit 425 by the air guide unit 52. Furthermore, after cooling the driver case 26 (more specifically, the driver circuit 25), the cooling air guided to the space between the driver case 26 and the heat shield plate fixing unit 425 is discharged from the air discharge hole 53 along the louver 54.

The heat shield plate 5 is integrally formed of, for example, a steel plate. That is, the bolt hole 55 is formed at a predetermined position of the steel plate by punch processing. In addition, an opening of a slit shape is formed by punch processing in the portion that is to be the heat shield plate body 51, and the air discharge hole 53 and the louver 54 are formed by bending the portion adjacent to the opening toward the surface side by bending processing. Furthermore, the air guide unit 52 is formed by bending the outer edge portion of the heat shield plate body 51 toward the surface side.

According to the above embodiment, for example, the following operational effects are obtained.

According to the above embodiment, the cooling air that has passed through the air guide passage 426 provided in the motor support unit 42 is guided to the driver case 26 through the air guide unit 52. In this way, the motor 2 (more specifically, the driver circuit 25) may be appropriately cooled. As a result, deterioration of the motor 2 over time may be delayed, so that the life of the fan device 1 may be extended, contributing to the reduction of waste and defective products.

In addition, the existing motor support unit 42 is provided with the air guide passage 426, and the air guide unit 52 is disposed so as not to protrude radially outward from the motor support unit 42. In this way, the cooling air that is blocked by the air guide unit 52 may be minimized. As a result, the cooling air needed for cooling the radiator may be ensured without increasing the size of the fan device 1.

Further, according to the above embodiment, by inclining the air guide passage 426 (more specifically, the inner peripheral surface of the outer peripheral wall 422) radially inward, the cooling air that has passed through the air guide passage 426 may be efficiently guided to the motor 2 side. Further, according to the above embodiment, the cooling air passing through the air guide passage 426 may be accelerated by gradually decreasing the opening area of the air guide passage 426 toward the outlet. As a result, the motor 2 may be efficiently cooled.

Further, according to the above embodiment, by covering the driver circuit 25 (more specifically, the driver case 26)

with the heat shield plate 5, the temperature of the motor 2 (more specifically, the driver circuit 25) may be prevented from rising due to radiant heat from the engine. In this way, the driver circuit 25 may be efficiently cooled with a small amount of cooling air. As a result, the fan device 1 may be further prevented from increasing in size.

Further, according to the above embodiment, by discharging the cooling air through the air discharge holes 53 provided in the heat shield plate body 51, the cooling air may be prevented from staying between the driver case 26 and the heat shield plate fixing unit 425. In this way, the flow of the cooling air guided between the driver case 26 and the heat shield plate fixing unit 425 through the air guide passage 426 and the air guide unit 52 becomes smooth. As a result, the driver circuit 25 may be efficiently cooled with even less cooling air.

Further, according to the above embodiment, by providing the louver 54 adjacent to the air discharge hole 53, the discharge direction of the cooling air may be controlled. Furthermore, by making the opening area A1 of the discharge hole 53 viewed from the thickness direction of the heat shield plate 5 smaller than the opening area A2 of the discharge hole 53 viewed obliquely along the inclination direction of the louver 54, the amount of infrared rays reaching the motor 2 from the engine through the air discharge hole 53 may be reduced without reducing the amount of cooling air discharged.

Furthermore, in the above embodiment, an example in which the fan device 1 is mounted on a vehicle driven by an engine has been described, but the vehicle on which the fan device 1 is mounted may be driven by an electric motor. In this case, radiant heat from the engine is not generated, so the heat shield plate body 51 may be omitted (that is, the air guide unit 52 may exist alone). Further, in the above embodiment, an example of the radiator has been described as an object to be cooled by the fan device 1, but the object to be cooled by the fan device 1 is not limited thereto.

The embodiments of the present invention have been described above. In addition, the present invention is not limited to the above-described embodiments, and includes various modified examples. For example, the above-described embodiments have been described in detail in order to describe the present invention in an easy-to-understand manner, and are not necessarily limited to those having all the configurations described. Further, a part of the configuration of the embodiment may be replaced with the configuration of another embodiment, and the configuration of another embodiment may also be added to the configuration of the embodiment. Furthermore, a part of the configuration of the embodiment may be added to, deleted from, or replaced with another configuration.

What is claimed is:

1. A fan device, comprising:
a motor, comprising a motor bracket, a rotor rotatably supported on a surface side of the motor bracket, a stator fixed to the surface side of the motor bracket and wound with a coil that generates a magnetic field for rotating the rotor, and a driver circuit fixed to a rear side of the motor bracket and controlling generation of the magnetic field by the coil;
a fan, comprising a boss fixed to the rotor, and blades each protruding radially outward from positions spaced apart in a circumferential direction on an outer peripheral surface of the boss; and
a shroud, comprising a shroud body formed with a fan housing hole that houses the fan, a motor support unit supporting the motor at a center of the fan housing hole, and a plurality of stays radially extending from the motor support unit toward the shroud body, wherein
the fan is disposed on a surface side of the motor support unit,
the motor is supported on a rear side of the motor support unit,
a plurality of air guide passages each penetrating in a thickness direction at positions spaced apart in the circumferential direction and radially outward from the boss are formed in the motor support unit, and
the fan device further comprises an air guide unit disposed facing the air guide passages on the rear side of the motor support unit, and guiding cooling air generated by the fan and passing through the air guide passages to the rear side of the motor bracket.

2. The fan device according to claim 1, wherein
the air guide passages are inclined radially inward of the motor support unit from the surface side to the rear side of the motor support unit.

3. The fan device according to claim 2, wherein
an opening area of the air guide passages on the rear side of the motor support unit is smaller than an opening area of the air guide passages on the surface side of the motor support unit.

4. The fan device according to claim 1, further comprising:
a heat shield plate covering the driver circuit on a rear side of the motor, wherein
the air guide unit is provided at an outer edge portion of the heat shield plate.

5. The fan device according to claim 4, wherein
an air discharge hole penetrating in a thickness direction and discharging the cooling air guided between the driver circuit and the heat shield plate by the air guide unit is formed in the heat shield plate.

6. The fan device according to claim 5, wherein
the heat shield plate comprises a louver inclined with respect to the thickness direction of the heat shield plate in order to control a flow of the cooling air discharged from the air discharge hole, and
an opening area of the air discharge hole viewed from the thickness direction of the heat shield plate is smaller than an opening area of the air discharge hole viewed obliquely along an inclination direction of the louver.

* * * * *